Dec. 19, 1967 B. D. LEETE 3,359,458
SOFT START CIRCUIT FOR PROCESS CONTROL
Filed Oct. 11, 1965
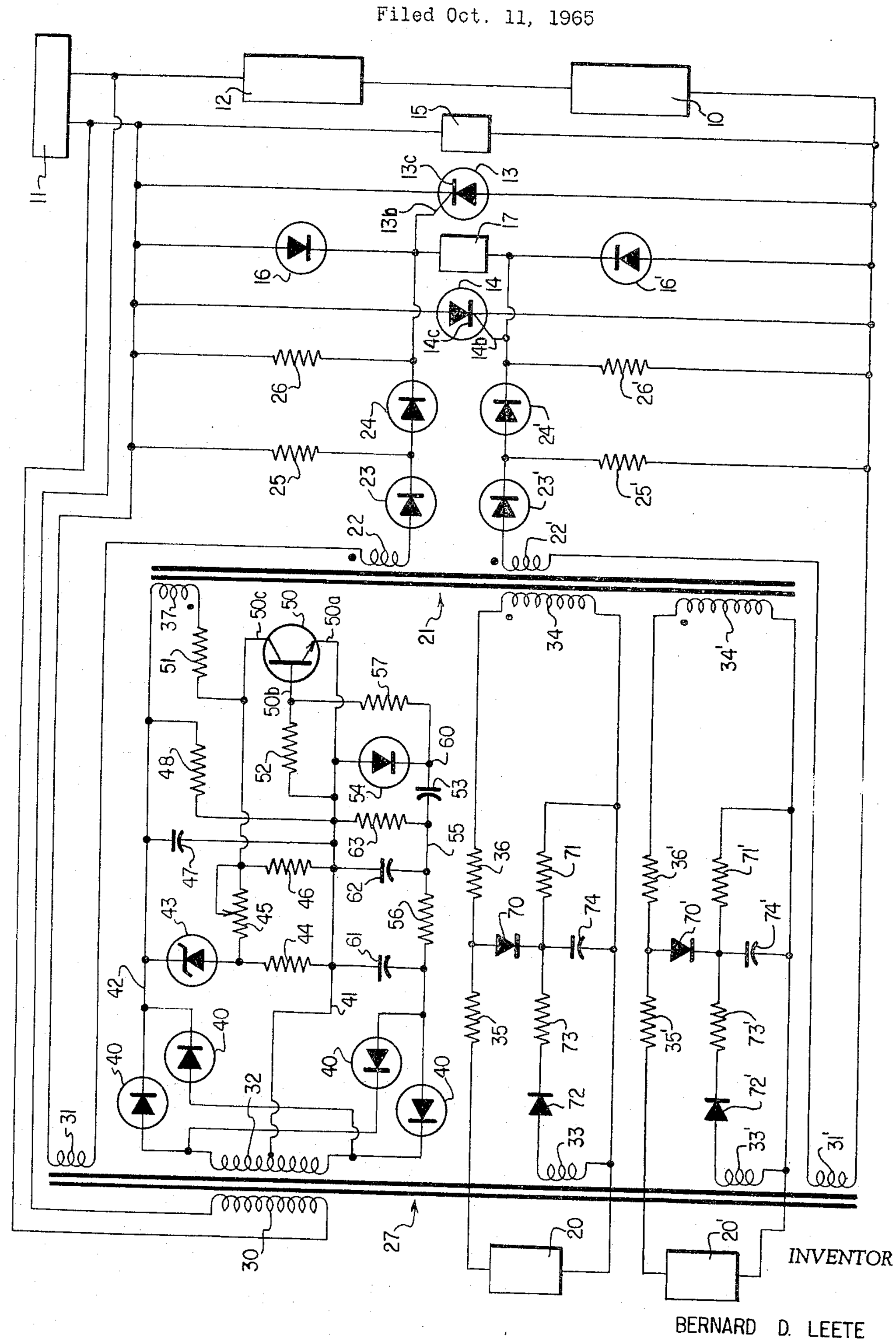
INVENTOR
BERNARD D. LEETE
BY [signature]
ATTORNEY United States Patent Office
3,359,458
Patented Dec. 19, 1967

3,359,458
SOFT START CIRCUIT FOR PROCESS CONTROL
Bernard D. Leete, Newtown Square, Pa., assignor to General Electric Company, a corporation of New York
Filed Oct. 11, 1965, Ser. No. 494,440
10 Claims. (Cl. 317—33)

This invention relates to a process control circuit adapted to regulate load energization and, more specifically, to an improved process control circuit which limits load current during a period of initial load energization.

Process control circuits wherein a load is controlled by static switching means such as silicon controlled rectifiers are known in the art. Regulation of the conduction of such static switching means can be accomplished by coupling means comprising a magnetic amplifier which includes a bias winding, a control winding and an output winding. Generally, the control winding is connected to a signal source, such as a computer, while the bias winding is energized by a direct current supply. As is known in the art, current in the bias winding saturates the magnetic amplifier in a first, or negative, direction whereas current in the control winding tends to reverse the magnetic saturation to a positive direction. When the magnetic amplifier is shifted to positive saturation, current can flow from a power source through the output winding and properly poled series rectifiers to a load connected to the magnetic amplifier.

When this type of system is used to control an inductive load, a heating load or a combination of these loads, excessive currents can exist during initial load energization, and this is caused by the initial energizing or magnetizing current in an inductive load or by the initial low impedance of a cold heating coil. These excessive currents can surpass maximum current limits for the static switching means and thereby damage them or can actuate current sensitive circuit protective devices. In either situation the resulting loss in operative time and in materials is objectionable.

When static switching means such as silicon controlled rectifiers are used, excessive current occurs when the silicon controlled rectifiers conduct substantially throughout their maximum conduction angles so that there is no effective current limiting during the energization period. Early firing and maximum conduction can be caused by any of the following conditions or a combination of them when a magnetic amplifier triggers the silicon controlled rectifier.

If the inductive load and the signal source are de-energized when the magnetic amplifier is saturated, the magnetic amplifier remains saturated until a non-saturating force is applied. In the saturated condition the silicon controlled rectifiers are fired early in the half-cycle because gating pulses are not blocked.

Still another reason for early firing occurs when the signal source has been operating while the main load power supply has been de-energized. Normally the signal source operates at an extremely low power consumption so that it is often more economical to allow the signal source to operate continuously. Even if the signal source is interconnected with the load so that de-energization of the load effectively disconnects the signal source power, there is a danger that the interconnecting means could fail. In either case control signals are constantly applied to the control winding, and these signals can shift the magnetic amplifier to positive saturation. This may not be instantaneous; but with any effective shut down the magnetic amplifier becomes positively saturated notwithstanding the fact that upon de-energization the magnetic amplifier was either negatively saturated or not saturated.

An object of this invention is to provide an improved process control circuit wherein load excitation currents are limited to safe values.

Another object of this invention is to provide an improved process control circuit which assures negative saturation upon sudden power supply de-energization.

It is another object of this invention to provide an improved process control circuit wherein input signals are effectively shunted when the power supply and coupling means are de-energized.

Still another object of this invention is to provide an improved process control circuit which limits load currents until the load assumes a normal operating state.

Briefly stated, this invention is applicable to controllable coupling means which regulate the conduction angle of static switching means and which can assume one of two states. In a first state the coupling means couples a signal from a signal source to the static switching means, but no coupling occurs when the coupling means is in the second state. Means are provided to shift the coupling means from its first state to its second state when the load supply is suddenly de-energized. Simultaneously, the other means shunt signals from the coupling means in response to the de-energization. Action by both the shift means and shunt means result in a controller which limits the load current to a safe value until the load assumes a normal state.

The novel features which are characteristic of this invention are set forth with particularity in the appended claims. The invention itself, however, as to its organization, together with further objects and advantages, may be understood by reference to the following description of an improved process control circuit taken in conjunction with the accompanying drawing and description.

The single figure of the drawing illustrates an improved process control circuit utilizing this invention.

Referring to the figure, a load 10 is connected to an alternating current power supply 11 by current transient protective means 12 and by a silicon controlled rectifier (SCR) 13 and SCR 14 back-to-back. Although load 10 can comprise any electrical means, this invention is particularly directed to inductive loads such as furnace transformers and heating means which provide a relatively low input impedance when the loads are initially energized. Current transient protective means 12 is designed to block current transients which are emitted from the power supply 11 as a result of line disturbances or other causes or which are reflected from the inductive load; this means can comprise a choke coil or other similar device. Two other protective means should also be utilized in accordance with the art as shown. A voltage transient means 15, connected in parallel with SCR's 13 and 14, can comprise a capacitor and resistor in series. This means acts in conjunction with another voltage protective device comprising diodes 16 and 16′ and a circuit 17 which requires some forward voltage minimum to conduct, such as a zener diode circuit. Voltage transient means 15, diodes 16 and 16′ and the circuit 17 thereby coact to protect the SCR's 13 and 14 from voltage transients due to switching or other reasons.

The circuit, comprising SCR's 13 and 14, load 10, power supply 11 and protective circuits 12, 15, 16, 16′ and 17 are all of a standard configuration. The circuit described below is adapted to control the firing angle of SCR's 13 and 14 and to limit current therethrough when the load impedance is relatively low by effectively blocking the application of any firing signals to SCR gates **13*b* and 14*b*** and then allowing the SCR firing angle to increase relatively slowly to its normal value as specified by the signal source.

In the following discussion, similar components have been designated by like numbers (i.e., signal source 20 and signal souce 20'). The firing angle of SCR's 13 and 14 is controlled by means of signal sources 20 and 20' which are coupled to SCR gates 13*b* and 14*b* by means of a magnetic amplifier 21. Magnetic amplifier 21 has an output winding 22 and an output winding 22' which are effectively connected to SCR gates 13*b* and 14*b* by a rectifier-load network. The network associated with output winding 22 comprises diodes 23 and 24 and resistors 25 and 26. Current for gate 13*b* is supplied by a transformer 27 which has an adjustable voltage primary 30 and a plurality of secondaries 31, 31', 32, 33 and 33'. Secondary 31 is connected in series with output winding 22, diode 23 and diode 24 between gate 13*b* and cathode 13*c*. Resistors 25 and 26 act as a load on the output winding 22 and secondary 31 when the firing angle is at a minimum and serve to divert small noise signals which could cause false firing of SCR 13. A similar firing circuit for SCR 14 comprises output winding 22', diodes 23' and 24', resistors 25' and 26' and secondary 31' connected between gate 14*b* and cathode 14*c*.

Magnetic amplifier 21 also has a plurality of control windings 34 and 34' associated with signal sources 20 and 20' respectively. Signals from signal source 20 are attenuated by series dropping resistors 35 and 36 which connect control windings 34 to signal source 20. A similar circuit including resistors 35' and 36' couples control winding 34' to signal source 20'. Although only two signal sources 20 and 20' and two control windings 34 and 34' have been shown, any number of signal sources and control windings can be utilized, the number being dependent upon the number of separate input signals required.

In addition, magnetic amplifier 21 has a bias winding 37 which is wound so that it produces a flux in opposition to that of control windings 34 and 34'. Current for bias winding 37 is supplied by regulated and unregulated direct current supplies energized by a full-wave bridge rectifier comprising diodes 40 connected across secondary 32. By using both regulated and unregulated current supplies to energize bias winding 37, some degree of line voltage variation is compensated so that the power does not vary greatly when the line voltage changes. Both power supplies are then connected between a center tap conductor 41 and a conductor 42 which is connected to a positive terminal of the bridge rectifier. A voltage dropping network comprising a zener diode 43 and a resistor 44 in series is connected between conductors 41 and 42. The regulated current source then comprises the zener diode 43, the bias winding 37 and a potentiometer 45 which are connected in series. Unregulated bias current is provided by the series connection of the conductor 42, the bias winding 37, a resistor 46 and conductor 41. Filtering for the bias supply is provided by capacitor 47 and bleeder resistor 48.

In the operation of this circuit, current through bias winding 37 sets up a flux in the core of magnetic amplifier 21 in a direction of negative saturation, whereas control windings 34 and 34' tend to drive the core to positive saturation. Further, current half-cycles from secondaries 31 and 31', which can bias diodes 23, 24, 23', and 24' "on," also tend to drive the core to positive saturation. Relative flux directions are shown by dots associated with each winding. Therefore, if flux components are produced by bias winding 37 and output windings 22 and 22', magnetic amplifier 21 assumes a non-saturated state. When all the flux producing windings are energized, the core of magnetic amplifier 21 is positively saturated so SCR's 13 and 14 can be fired. When the power supply 11 is suddenly disconnected from the circuit, there is a residual flux which can cause magnetic amplifier 21 to become positively saturated when secondaries 31 and 31' are energized so that SCR's 13 and 14 immediately fire at a maximum conduction angle causing excessive currents. This invention causes magnetic amplifier 21 to become saturated in the negative direction when power supply 11 is suddenly disconnected.

Such negative saturation occurs when a current discharge through bias winding 37 occurs to increase the normal bias current. Capacitor 47, which is charged during its operation as a bias filter, provides the discharge when a static switching means is closed. Such a static switching means can comprise a transistor 50, shown particularly as an NPN transistor having its collector 50*c* connected to one side of bias winding 37 through a current limiting resistor 51, its emitter 50*a* connected to center tap conductor 41 and its base 50*b* also connected to center tap conductor 41 through a biasing resistor 52. Transistor 50 is maintained in a nonconducting state by a capacitor 53 and diode 54 connected in series between center tap conductor 41 and a negative return conductor 55 which is connected to the negative terminal of the rectifier network by a resistor 56. A capacitor discharge resistor 57 is connected between the capacitor-diode junction 60 and the base 50*b*. With diode 54 properly poled, capacitor 53 is charged by a charging circuit comprising one side of the center tapped transformer secondary 32 and a filter network comprising filter capacitors 61 and 62, resistor 56 and bleeder resistor 63.

During normal operation, capacitor 53 charges, transistor 50 assumes a blocking state, and capacitor 47, which acts as a bias filter, also charges to the full voltage. Diode 54 shunts emitter 50*a* and base 50*b* through resistor 57 so that the base 50*b* is substantially at the voltage of emitter 50*a* when power supply 11 is energized; and transistor 50 is effectively blocked. If the power supply 11 is rapidly de-energized, then a charge remains on capacitors 47, 53, 61, and 62. However, time constants in the circuit are such that the voltage across capacitors 61 and 62 collapses more rapidly than the voltage across capacitors 47 and 53 so capacitor 47 biases collector 50*c* positive with respect to emitter 50*a* and turns on transistor 50. With the collapse of voltage across capacitors 61 and 62, reverse bias is applied to diode 54 by capacitor 53 so that diode 54 blocks. The only effective discharge path for capacitor 53 is then through resistor 57 and resistor 51 resulting in a proper bias on base 50*b* to turn on transistor 50. Capacitor 47 then discharges through bias winding 37, current limiting resistor 51 and transistor 50 to shift magnetic amplifier 21 into negative saturation.

It is also possible that control currents may exist after the circuit has been de-energized and these could bring magnetic amplifier 21 out of negative saturation so that on reapplication of power SCR's 13 and 14 would fire immediately. Therefore, it is desirable to shunt or block the control currents and thereby effectively disable control windings 22 and 22' simultaneously with any de-energization of power supply 11. To this end a disabling circuit including a diode 70 and a resistor 71 are connected across control winding 34 and dropping resistor 36. Secondary 33, a rectifying diode 72, and resistor 73 are connected in series across resistor 71, and a capacitor 74 is connected in parallel with resistor 71 so that a positive direct current potential is applied to the cathode of the diode 70 which exceeds that of signals applied by signal source 20. Therefore, when the circuit is energized the voltage supplied by secondary 33 is sufficient to block diode 70 so that substantially all the control currents pass through control winding 34. However, when the power supply is de-energized the blocking voltage is removed; and diode 70 and resistor 71 form a low impedance shunt to bypass control currents and thereby effectively block them from reaching the control winding 34. A similar disabling circuit comprising secondary 33', diodes 70' and 72', resistors 71' and 73' and capacitor 74' is used in association with control winding 34'.

Considering the entire circuit, it can be seen that the SCR's 13 and 14 do not turn on at the first instance of power reapplication because magnetic amplifier 21 is saturated in the negative direction. Recovery of magnetic amplifier 21 often requires several cycles of power line frequency after the diodes 70 and 70' resume a blocking state. Further delay can be obtained by choosing resistors 71 and 73 and capacitor 74 so that there is a time delay before diode 70 blocks with similar consideration be given to capacitor 74'. This delay is sufficient to limit current during start up of the load.

In summary, the invention as described above utilizes a coupling device which has a first state wherein signals applied to the coupling device are coupled to control elements and a second state whereby there is no coupling. Means are provided to shift the coupling device to the second state when the power is suddenly removed as by disconnection, and disabling means are provided to effectively shunt or block control currents from the coupling device after the power is removed. In this manner, when the circuit is re-energized current inrush is substantially eliminated and the circuit elements in the load circuit are thereby protected.

While the present invention has been described with reference to a particular embodiment thereof and a particular system, various modifications may be made by those skilled in the art without actually departing from the spirit and scope of the invention. Therefore, the appended claims are intended to cover all such equivalent variations which come within the true spirit and scope of the invention.

What I claim as new and desire to secure by Letters Patent of the United States is:

1. A control circuit for energizing a load in response to signals from at least one signal source, the load being energized by a power supply, comprising:

(a) static switching means adapted to connect the load to the power supply;

(b) coupling means to selectively couple signals to said static switching means, said coupling means having a first state whereby signals are coupled to said static switching means and a second state whereby signals are not coupled to said static switching means, (c) condition shifting means connected to the power supply and to said coupling means to shift said coupling means from said first state to said second state when the power supply is de-energized, and (d) signal disabling means for each signal source, said signal disabling means connecting the power supply and said coupling means to its associated signal source and effectively blocking signals from said coupling means when the power supply is disconnected.

2. A control circuit as recited in claim 1 wherein said static switching means comprises at least one silicone controlled rectifier.

3. A control circuit as recited in claim 1 wherein said signal disabling means comprises switching means having a first state whereby signals are applied to said coupling means and a second state whereby said signals are effectively blocked from said coupling means.

4. A control circuit as recited in claim 1 having means to protect said static switching means from voltage and current transients including a voltage transient shunt circuit in parallel with said static switching means and a current transient protection circuit in series with the load.

5. A control circuit as recited in claim 1 wherein said coupling means comprises a saturable means having output windings connected to said static switching means, control windings connected to said signal source, and a bias winding which is connected to said condition shifting means.

6. A control circuit as recited in claim 5 wherein said condition shifting means comprises a capacitor, means connected to the power supply to charge said capacitor, and semiconductor switching means responsive to de-energization of the power supply and connected to said capacitor to discharge said capacitor through said bias winding.

7. In a circuit which includes a load, a power supply and static switching means responsive to at least one signal source to control the energization of the load, a circuit to control the initial energization of the load to limit current supplied thereto comprising:

(a) coupling means adapted to couple each signal source to the static switching means, said coupling means having a first state whereby signals are coupled to the static switching means and a second state whereby signals are not coupled to the static switching means, (b) condition shifting means connected to said coupling means and responsive to de-energization of the power supply to shift said coupling means from said first state to said second state, and (c) signal shunting means for each signal source, said signal shunting means connecting the power supply and said coupling means to its associated signal source and shunting signals past said coupling means when the power supply is disconnected.

8. A circuit as recited in claim 7 wherein said signal shunting means comprises switching means having a first state whereby signals are applied to said coupling means and a second state whereby said signals are shunted through the semiconductor means and past the coupling means, said semiconductor means assuming said first state when the power supply is energized and said second state when the power supply is de-energized.

9. A circuit as recited in claim 7 wherein said coupling means comprises saturable means having at least one output winding adapted to be connected to the static switching means, at least one control winding adapted to be connected to each signal source and a bias winding connected to said condition shifting means.

10. A control circuit as recited in claim 9 wherein said condition shifting means comprises a capacitor, means connected to the power supply to charge said capacitor, and semiconductor switching means connected to said bias winding and said capacitor charging means and responsive to the de-energization of the power supply to discharge said capacitor through the bias winding.

References Cited

UNITED STATES PATENTS

| | | | |
|---|---|---|---|
| 2,902,609 | 9/1959 | Ostroff et al. | 307—88.5 |
| 3,128,440 | 4/1964 | Davis | 323—60 |
| 3,129,341 | 4/1964 | Rockafellow | 307—88.5 |
| 3,215,896 | 11/1965 | Shattuck et al. | 317—16 |
| 3,222,575 | 12/1965 | Dexter | 317—20 |
| 3,295,020 | 12/1966 | Borkovitz | 317—33 |

MILTON O. HIRSHFIELD, *Primary Examiner.*

J. D. TRAMMELL, *Assistant Examiner.*